United States Patent [19]

Turner et al.

[11] Patent Number: 5,693,540
[45] Date of Patent: Dec. 2, 1997

[54] METHOD OF FABRICATING INTEGRATED CIRCUITS

[75] Inventors: John E. Turner, Santa Cruz; Kevin A. Norman, Belmont; Thomas Henry White, Santa Clara; Wilson Wong, San Francisco, all of Calif.

[73] Assignee: Altera Corporation, San Jose, Calif.

[21] Appl. No.: 656,448

[22] Filed: May 31, 1996

Related U.S. Application Data

[60] Provisional application No. 60/014,799, Apr. 3, 1996.
[51] Int. Cl.$^6$ .................................................. H01L 21/00
[52] U.S. Cl. .................................. 437/7; 437/43; 437/51
[58] Field of Search ............................. 437/7, 8, 43, 48, 437/51, 56

[56] References Cited

U.S. PATENT DOCUMENTS 5,037,771 8/1991 Lipp ........................................... 437/7
5,422,317 6/1995 Hua et al. ................................. 437/51
5,444,000 8/1995 Ohkubo et al. .......................... 437/51

*Primary Examiner*—Chandra Chaudhari
*Attorney, Agent, or Firm*—Fish & Neave; Robert R. Jackson; G. Victor Treyz

[57] ABSTRACT

A method of fabricating integrated circuits is provided that allows new integrated circuits to be fabricated with reduced die areas and reduced power consumptions relative to old integrated circuits. The new circuits are interchangeable with the old integrated circuits, because the delay times for the data pathways through the new circuits are the same as the delay times for the data pathways through the old circuits. A family of new circuits, each of which is compatible with a corresponding one of a series of old circuits, can be fabricated using a common circuit layout. Each new circuit is associated with a parameter value that governs the delay time of a component in a data pathway through the circuit and ensures that the new circuit is compatible with the corresponding old circuit.

7 Claims, 7 Drawing Sheets

FIG. 5

| # | PROCESS | MINIMUM GATE LENGTH (μm) (n/p) | $P_1/P_2$ (μm) | $P_3/P_4$ (μm) | $L_1$ (ns) | $L_2$ (ns) | $L_3$ (ns) | $L_4$ (ns) | $L_5$ (ns) | $L_6$ (ns) | $L_7$ (ns) | $L_8$ (ns) | $L_9$ (ns) | TOTAL DELAY (ns) |
|---|---|---|---|---|---|---|---|---|---|---|---|---|---|---|
| 1 | 1 | 1.5/1.5 | 1.5/1.5 | 1.5/1.5 | 5 | 5 | 5 | 5 | 5 | 5 | 5 | 5 | 5 | 35 |
| 2 | N | 0.65/0.7 | 3.0/3.0 | 3.7/3.7 | 9.5 | 5 | 9.5 | 5 | 2 | 2 | 2 | 9.5 | 5 | 35 |
| 3 | 2 | 1.0/1.0 | 1.0/1.0 | 1.0/1.0 | 3 | 4 | 3 | 4 | 3 | 4 | 3 | 3 | 4 | 24 |
| 4 | N | 0.65/0.7 | 1.5/1.5 | 1.5/1.5 | 5 | 4 | 5 | 4 | 2 | 2 | 2 | 5 | 4 | 24 |

5,693,540

METHOD OF FABRICATING INTEGRATED CIRCUITS

CROSS REFERENCE TO RELATED APPLICATION

This application claims the benefit of U.S. Provisional application Ser. No. 60/014,799, filed Apr. 3, 1996.

BACKGROUND OF THE INVENTION

This invention relates to semiconductor integrated circuit fabrication techniques, and more particularly, to methods for fabricating integrated circuits that are interchangeable with existing integrated circuits, but which have reduced die areas.

The fabrication processes used to manufacture integrated circuits are continually improving. Typical advances make it possible to create thinner layers of oxides and to improve doping profiles. Perhaps most importantly, newer processes make it possible to reduce the lateral dimensions of structures on the integrated circuit. For example, metal-oxide-semiconductor (MOS) transistors can be fabricated with shorter gate lengths. Reducing the dimensions of the structures on a circuit typically improves the switching speed of the active circuit components and allows the circuit to be fabricated with a smaller die area. The faster switching speed and smaller die area improve the power consumption of the circuit and make the circuit more economical to manufacture.

Although it may sometimes be acceptable to form a new circuit by uniformly reducing the dimensions of the structures of an old circuit layout, difficulties can arise if the new circuit no longer conforms to the performance standards of the old circuit. For example, scaling down circuitry uniformly may decrease the propagation delays associated with certain signal pathways more than desired. Such unexpectedly short propagation delays could cause compatibility problems between the new circuit and old systems designed to accommodate older, slower circuits.

It is therefore an object of the present invention to provide a method for fabricating integrated circuits using improved fabrication processes.

It is a further object of the present invention to provide a method for fabricating integrated circuits that allows a circuit design for an old circuit to be implemented using a new fabrication process to produce a new circuit that has a reduced die area relative to the old circuit, yet which is compatible with the performance standards of the old circuit.

It is also an object of the present invention to provide an integrated circuit fabrication method in which a common circuit layout is used to fabricate a family of new circuits each of which is compatible with a corresponding one of a series of old circuits and which has a reduced die area relative to the corresponding old circuit.

SUMMARY OF THE INVENTION

These and other objects of the invention are accomplished in accordance with the principles of the present invention by providing a method for fabricating integrated circuits in which new circuit fabrication processes are used to produce new circuits that are interchangeable with old circuits using the same circuit design. The new circuits have reduced die areas relative to the old circuits, which make them more economical to manufacture and reduces power consumption.

In order to ensure that the circuits implemented using the new process are interchangeable with versions of the circuit design fabricated with old processes, the die areas of the new circuits are reduced without changing the delay times associated with the data pathways through the old circuits.

One way in which an old circuit can be reduced in size without significantly changing the performance characteristics of the circuit is to specifically identify those portions of the old circuit that can be reduced in size without affecting the delay times associated with passing data through the circuit. For example, it may be possible to reduce the area allocated for the testing circuitry and bonding pads on an old circuit without changing the delay times associated with the logic components on the circuit used to process data. Components that have been identified as not affecting the delay time of the data pathways through the circuit are reduced in size as much as permitted by the new process during fabrication on the new circuit.

The die area of an old circuit can also be reduced by shrinking the dimensions of all of the circuitry on the integrated circuit to the greatest extent permitted by the new process with the exception of a relatively small number of structures in the components in the data pathways of the circuit. Because most circuitry on the new circuit is reduced in size using the new process, the new circuit is smaller than the old circuit. However, shrinking the dimensions of all of the circuitry reduces the delay times associated with certain data pathways through the circuit. To ensure that the new circuit is compatible with the old circuit, the delay times of the components containing the structures are intentionally increased. These intentionally slower components of the new circuit ensure that the data pathways of the new circuit have total delay times that are equal to those of the old circuit. The economies associated with smaller die areas are therefore achieved while maintaining compatibility with popular older circuits.

A family of new circuits can be fabricated based on a common circuit layout. Each circuit in the family of new circuits is compatible with one of a series of old circuits that share a common circuit design. Each new circuit is associated with at least one parameter value. The parameter values associated with each circuit govern the size of structures in certain circuit components that govern the delay times associated with those components.

Further features of the invention, its nature and various advantages will be more apparent from the accompanying drawings and the following detailed description of the preferred embodiments.

BRIEF DESCRIPTION OF THE DRAWINGS

FIG. 5 is a table showing the delay of each of the components of the CMOS circuit design of FIG. 4 for two old circuits and two corresponding new circuits.

DETAILED DESCRIPTION OF THE PREFERRED EMBODIMENTS

Figure 1:
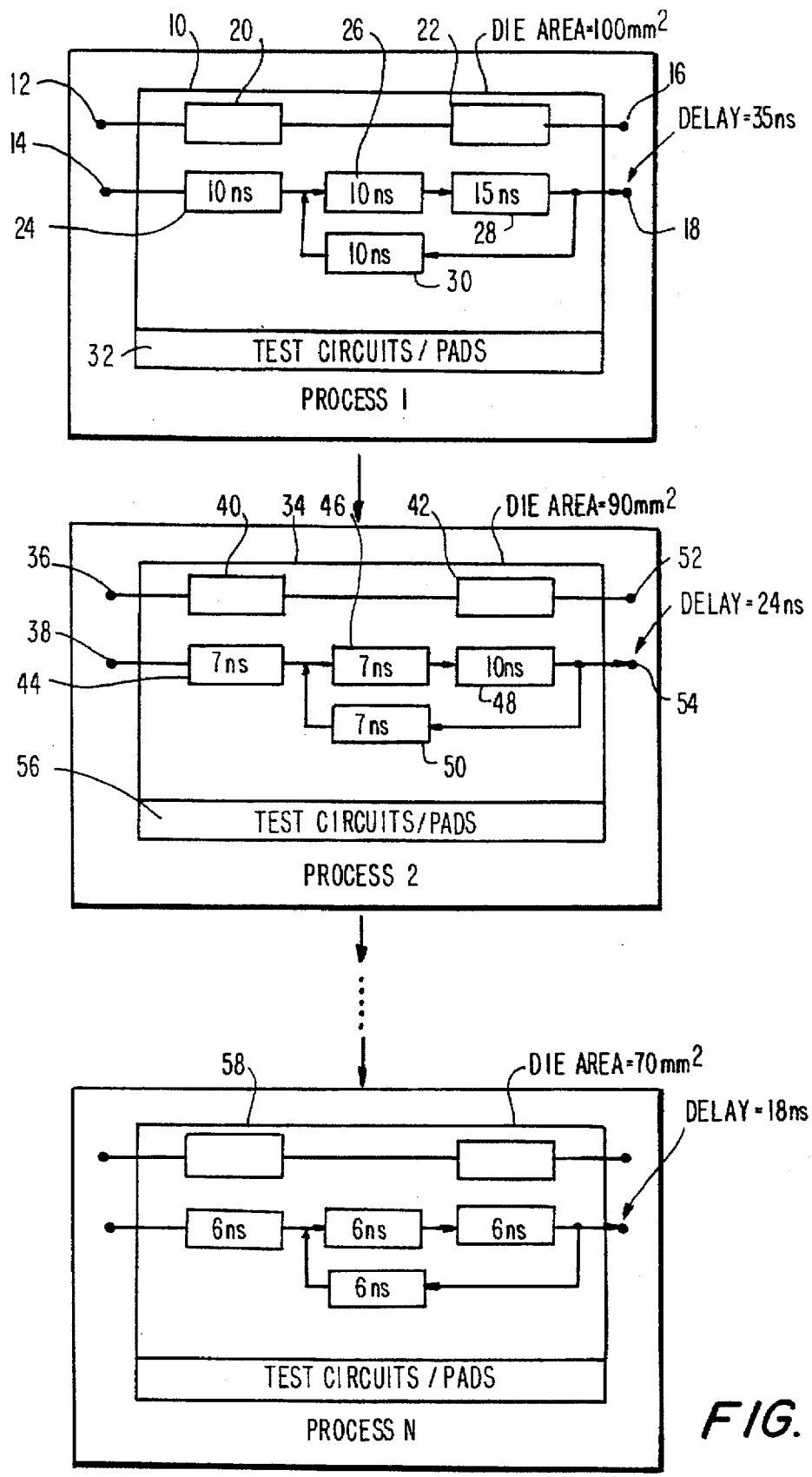
FIG. 1 is a circuit diagram of an illustrative integrated circuit design implemented using successively newer fabrication processes.

An illustrative integrated circuit design implemented using various fabrication processes is shown in FIG. 1. Integrated circuit 10 has been fabricated using process 1. Integrated circuit 10 has data inputs 12 and 14 and data outputs 16 and 18. Data flows from input 12 to output 16 via logic circuit components 20 and 22. Logic components 24, 26, 28, and 30 perform logic functions on data supplied to input 14 and provide a corresponding data output signal at output 18. Each logic component has an associated propagation delay. Logic components 24, 26, and 30 each have a delay of 10 ns. Logic component 28 has a delay of 15 ns. Data that passes from data input 14 to data output 18 via components 24, 26, and 28 experiences a total delay of 35 ns.

In addition to logic components, integrated circuit 10 has test circuits and bonding pads 32, which typically consume approximately half of the die area of integrated circuit 10. The total die area of integrated circuit 10 is 100 mm$^2$.

When an integrated circuit design is transferred from an old process to a new process, it is generally possible to leave the functionality of the circuit undisturbed. For example, the circuit design used to fabricate integrated circuit 10 with process 1 can be used to fabricated integrated circuit 34 with process 2. Because the same circuit design is used for both integrated circuits 10 and 34, integrated circuit 34 performs the same logic functions as integrated circuit 10. Data inputs 36 and 38 of integrated circuit 34 receive data, which is processed by logic components 40, 42, 44, 46, 48, and 50. Data output signals are provided at data outputs 52 and 54. Integrated circuit 34 also has test circuits and pads 56, which perform the same functions as test circuits and pads 32 of integrated circuit 10.

Although integrated circuit 34 performs the same logic functions as integrated circuit 10, using fabrication process 2, which is a newer and more advanced process than process 1, results in a smaller die area and a shorter delay time along the pathways between data inputs and outputs. For example, integrated circuit 34 has a total die area of 90 mm$^2$, rather than 100 mm$^2$ for integrated circuit 10. The total delay time for the data pathway between data input 38 and data output 54 is 24 ns compared with a total delay time of 35 ns for the data pathway between data input 14 and data output 18 of integrated circuit 10. Circuits fabricated with newer processes also exhibit reduced power consumption relative to older circuits.

Similar performance improvements are achieved each time the circuit design is implemented in a newer process. As shown in FIG. 1, when the circuit design of integrated circuits 10 and 34 is implemented using process N, the die area of integrated circuit 58 is 70 mm$^2$ and the total delay time is 18 ns.

The smaller die area of newer integrated circuits is partly the result of a reduction in the size of testing circuits and bonding pads. For example, the smaller die area of integrated circuit 34 compared with integrated circuit 10 is due in part to a reduction in the size of testing circuits and pads 56 compared with the size of testing circuits and pads 32. Improvements in process 2 over process 1 allow the transistors and other components of the testing circuitry to be fabricated in a smaller area. In addition, improvements in process 2 and the related processes used for forming bonding pad connections allow the size of the bonding pads to be reduced.

Because test circuits and pads 56 are not used for data functions, reducing the size of test circuits and pads 56 by using process 2 rather than process 1 does not affect the delay times associated with the data pathways through circuit 34. However, when the portions of an older integrated circuit that are used to perform logic functions are implemented using a new process, the resulting new circuit will generally no longer be compatible with systems designed for use with the older circuit. When the logic components along the data pathways of the circuit are fabricated using the new process, the delay times associated with the components are reduced.

Specifically, transistors fabricated with the new process have shorter gate lengths, which causes them to switch more rapidly. The delay times of the data pathways in the new circuit will therefore be shorter than those of the old circuit. If a system is designed to use a circuit with the longer data pathway delay times of the old circuit, the new circuit will not be compatible with the old circuit. Although such a new circuit may be less expensive than the older circuit because of its reduced die area, many users of the old circuit will not be able to use the new circuit in their systems.

Despite the compatibility problems associated with the conventional approach, circuit designs are still transferred from older processes to newer processes to take advantage of the smaller die areas and faster performance available with newer fabrication processes. A typical migration path is shown in FIG. 1, in which a circuit design is successively implemented using process 1, process 2, ..., and process N. Each fabrication process is more advanced than the previous process. Accordingly, both the die area and the data path delay times are reduced between each successive circuit.

Figure 2:
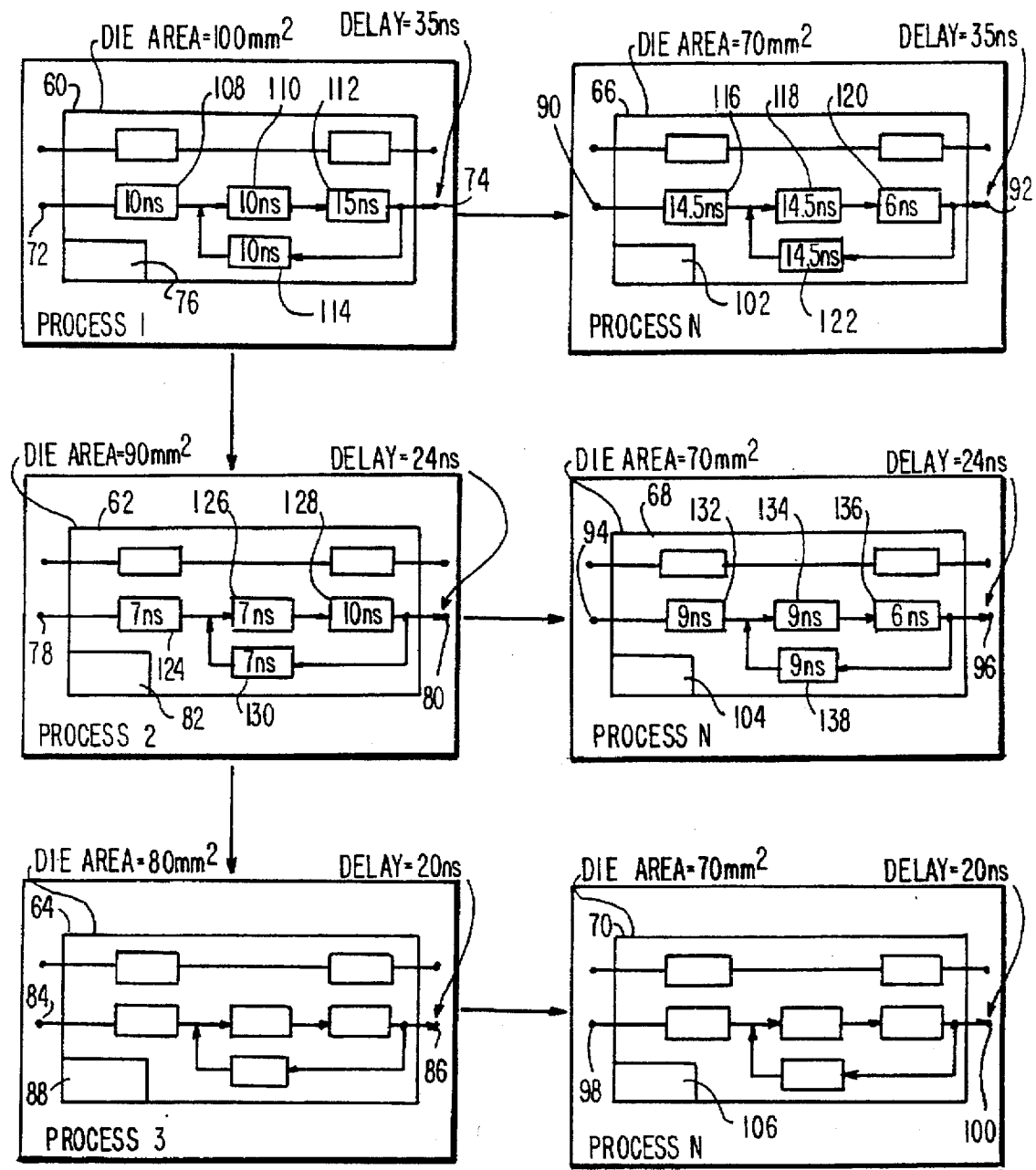
FIG. 2 is a circuit diagram of the integrated circuit design of FIG. 1 implemented using various fabrication processes. The new circuits on the right side of FIG. 2 are interchangeable with corresponding old circuits on the left side of FIG. 2.

The conventional approach for developing successive versions of a common integrated circuit design is also shown on the left side of FIG. 2. Process 1 is the oldest, least advanced process and process N is the newest, most advanced process. Integrated circuits 60, 62, 64, 66, 68, and 70 share a common circuit design. Initially, a circuit design is implemented using process 1 to produce integrated circuit 60. When process 2 becomes available, the circuit design of circuit 60 is implemented using process 2 to produce integrated circuit 62. When process 3 becomes available, the circuit design of circuit 62 is implemented using process 3 to produce integrated circuit 64, and so forth, continuing to process N, which is the newest process.

As a result of this conventional development approach, there are at least three old versions of the circuit design of FIG. 2: integrated circuits 60, 62, and 64. Integrated circuit 60 has a die area of 100 mm$^2$ and a delay time of 35 ns for the data pathway between data input 72 and data output 74. Integrated circuit 60 also has test circuits and pads 76. Integrated circuit 62 has a die area of 90 mm$^2$ and a delay time of 24 ns for the data pathway between data input 78 and data output 80. Integrated circuit 62 also has test circuits and pads 82. Integrated circuit 64 has a die area of 80 mm$^2$ and a delay time of 20 ns for the data pathway between data input 84 and data output 86. Integrated circuit 64 also has test circuits and pads 88.

Although each of integrated circuits 60, 62, and 64 may be commercially successful, users with systems designed for a given integrated circuit are generally unable to use versions of the circuit design implemented using a new process, because the data pathway delay times in the new circuits are too short to allow the new circuits to be interchangeable with the old circuits. Thus, although circuits 62 and 64 are more economical than circuit 60, circuits 62 and 64 are not interchangeable with circuit 60.

In accordance with the present invention, circuits 66, 68, and 70 on the right side of FIG. 2 are fabricated using the most advanced process available, but with delay times arranged so that circuits 66, 68, and 70 are compatible with circuits 60, 62, and 64 on the left side of FIG. 2. For example, integrated circuit 66 is fabricated using process N, so the die area of integrated circuit 66 is 70 mm$^2$, rather than 100 mm$^2$ for integrated circuit 60, which was fabricated using process 1. The delay time between data input 90 and data output 92 of integrated circuit 66 is 35 ns, which makes integrated circuit 66 compatible with integrated circuit 60. Integrated circuit 66 can therefore be used interchangeably with integrated circuit 60 in systems applications that require slower circuits of the type of integrated circuit 60. Because integrated circuits 60 and 66 are interchangeable, the economic benefits of using the smaller die area of integrated circuit 66 can be passed on to a user who must use a circuit compatible with integrated circuit 60.

Integrated circuit 68 is fabricated using process N, so the die area of integrated circuit 68 is 70 mm$^2$, rather than 90 mm$^2$ for integrated circuit 62, which was fabricated using process 2. The delay time between data input 94 and data output 96 of integrated circuit 68 is 24 ns, which makes integrated circuit 68 compatible with integrated circuit 62. Integrated circuit 68 can therefore be used interchangeably with integrated circuit 62.

Integrated circuit 70 is fabricated using process N, so the die area of integrated circuit 70 is 70 mm$^2$, rather than 80 mm$^2$ for integrated circuit 64, which was fabricated using process 3. The delay time between data input 98 and data output 100 of integrated circuit 70 is 20 ns, which makes integrated circuit 70 compatible with integrated circuit 64. If desired, integrated circuit 70 can be used interchangeably with integrated circuit 64.

Part of the reduction in die area that is achieved when implementing integrated circuits 60, 62, and 64 using process N is achieved by reducing the die area occupied by test circuits and pads 76, 82, and 88. The die areas occupied by test circuits and pads 102, 104, and 106 are less than the respective die areas occupied by test circuits and pads 76, 82, and 88. The smaller die areas associated with test circuits and pads 102, 104, and 106 help reduce the die areas of circuits 66, 68, and 70 and do not affect the delay times of the data pathways in circuits 66, 68, and 70.

If desired, the die areas occupied by integrated circuits 66, 68, and 70 can be further reduced by fabricating much of the remaining circuitry in circuits 66, 68, and 70 as small as possible using process N. Because this has the effect of reducing the delay times associated with certain circuit components, the delay times associated with these or other circuit components are intentionally increased to compensate, while still achieving an overall reduction in die area.

For example, circuit components 108, 110, and 112 of integrated circuit 60 form a data pathway from data input 72 to data output 74 that exhibits a delay time of 35 ns. Component 114 provides feedback. In order to reduce the die area occupied by integrated circuit 60 to 70 mm$^2$, the circuitry in component 112 is reduced to the smallest dimensions possible using process N to form component 120. The circuitry in components 108, 110, and 114 is also preferably reduced in size when forming components 116, 118, and 122, although certain structures in components 116, 118, and 122 are deliberately made larger than would otherwise be the case, so that components 116, 118, and 122 will exhibit longer delay times. The longer delay times of components 116 and 118 compensate for the reduction in the delay time associated with component 120.

Specifically, reducing the dimensions of component 120 as much as possible using process N, causes the delay time associated with component 120 to drop to 6 ns compared with a delay time of 15 ns for component 112. In order to compensate for this drop in delay time, the delay times of components 116 and 118 are each increased to 14.5 ns, so that the total delay time for integrated circuit 66 is 35 ns, as desired. The delay time associated with feedback component 122 is also increased to 14.5 ns to ensure that the operation of component 122 is properly synchronized with components 116, 118, and 120. Because most of the circuitry of components 116, 118, 120, and 122 is reduced in size, the relatively small increases in the dimensions of the structures in components 116, 118, and 122 to adjust their delay times does not have a significant impact on the die area of circuit 66.

Integrated circuit 68, which has a die area of 70 mm$^2$, is fabricated similarly. Components 124, 126, and 128 of integrated circuit 62 form a data pathway from data input 78 to data output 80 that exhibits a delay time of 24 ns. In order to reduce the die area occupied by integrated circuit 62 to 70 mm$^2$, the circuitry in component 128 is reduced to the smallest dimensions possible using process N to form component 136. The circuitry in components 124, 126, and 128 is also reduced in size when forming components 132, 134, and 138, although certain structures in components 132, 134, and 138 are deliberately made larger than would otherwise be the case, so that components 132, 134, and 138 will exhibit longer delay times.

Reducing the dimensions of component 136 as much as possible using process N causes the delay associated with component 136 to drop to 6 ns from the delay of 10 ns associated with component 128. To compensate for this drop in delay time, the delays of components 132 and 134 are each increased to 9 ns, so that the total delay for integrated circuit 68 is 24 ns, as desired. The delay associated with feedback component 138 is also increased to 9 ns, to ensure that component 138 is properly synchronized with components 132, 134, and 136. Because most of the circuitry of components 132, 134, 136, and 138 is reduced in size, the relatively small increases made to the dimensions of the structures in components 132, 134, and 138 to adjust their delay times does not have a significant impact on the total die area of circuit 68.

Figure 3:
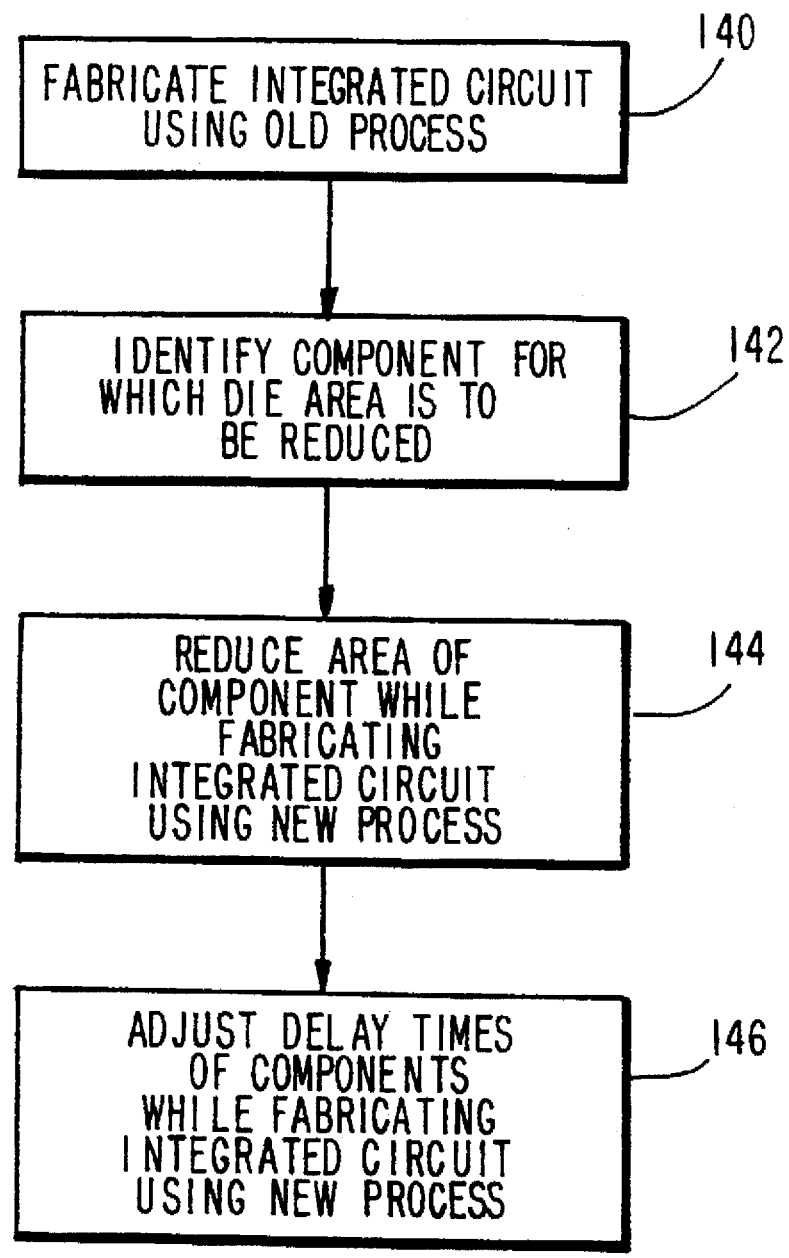
FIG. 3 is a flow chart of an illustrative method for fabricating integrated circuits in accordance with the present invention.

The steps involved in fabricating integrated circuits such that the delay times of new circuits are compatible with the delay times of old circuits are shown in FIG. 3. At step 140 an integrated circuit is fabricated using an old process (e.g., process 1). At step 142, at least one circuit component (e.g, test circuits and pads 76 or component 112 of circuit 60) is identified which is to be fabricated with reduced dimensions using the new process. The die area of the component identified in step 142 is reduced at step 144 while fabricating the integrated circuit using the new process (e.g., when fabricating test circuits and pads 102 or component 120 of circuit 66). If necessary, when fabricating a new circuit at step 146, the delay times associated with the circuitry of some of the components (e.g., components 116 and 118 of FIG. 2) are lengthened to compensate for the shorter delay associated with the component whose area was reduced in step 144. Preferably, the die area of more than one circuit component can be reduced and at least some of the components whose die areas are reduced contain certain structures that are intentionally fabricated with larger dimensions to increase the delay times associated with those components.

The delay associated with a circuit component can be controlled during fabrication by adjusting various device parameters. For example, in a complementary metal-oxide-semiconductor (CMOS) integrated circuit, the delay associated with a given component can be controlled by controlling the gate lengths of some of the transistors that make up the component. Accordingly, if the integrated circuit to be fabricated in a new process with delay times compatible with an old circuit is a CMOS device, it is possible to adjust the delay times of various components in the data path by controlling the lengths of the gates in the components. With the exception of the transistors whose gate lengths have been increased, the new circuit can be fabricated with circuitry that is as small as permitted by the new process.

For some circuit designs, maximizing the die area reduction is best achieved when the delay times of all of the components in the data pathways of the new circuit are maintained the same as the delay times of the corresponding components in the old circuit. This is accomplished by reducing the dimensions of the circuitry in each of the components of the new circuit as much as permitted by the new process, with the exception of certain structures. The dimensions of these structures are intentionally increased, so that the delay times of the components in the data pathway of the new circuit are maintained equal to the delay times of the corresponding components in the old circuit.

For other circuit designs, maximizing the die area reduction is best achieved when the delay times of some of the components in the data pathways of the new circuit are allowed to drop relative to the delay times of the corresponding components in the old circuit. The delay times of the remaining components in the new circuit are increased to compensate. This approach is used in the circuit design of circuits 60, 62, 64, 66, 68, and 70, where the die area reduction of circuit 60 is maximized by allowing the delay times associated with components such as component 120 in circuit 66 to drop, while increasing the delay times of the remaining components (i.e., components 116 and 118) to compensate.

The die areas of the components whose delay times are allowed to drop are reduced considerably using the new process, whereas the die areas of the remaining components in the new circuit do not drop as much as they otherwise might, because the remaining components contain certain structures whose dimensions are increased to lengthen their associated delay times. However, the reduction in the die areas of the components whose delay times drop more than offsets any adverse impact on the die area reductions that can be achieved by the remaining components. For circuit designs that merit this approach, allowing some delay times to go down while others go up maximizes the net reduction in the total die area of the new circuit.

Figure 4:
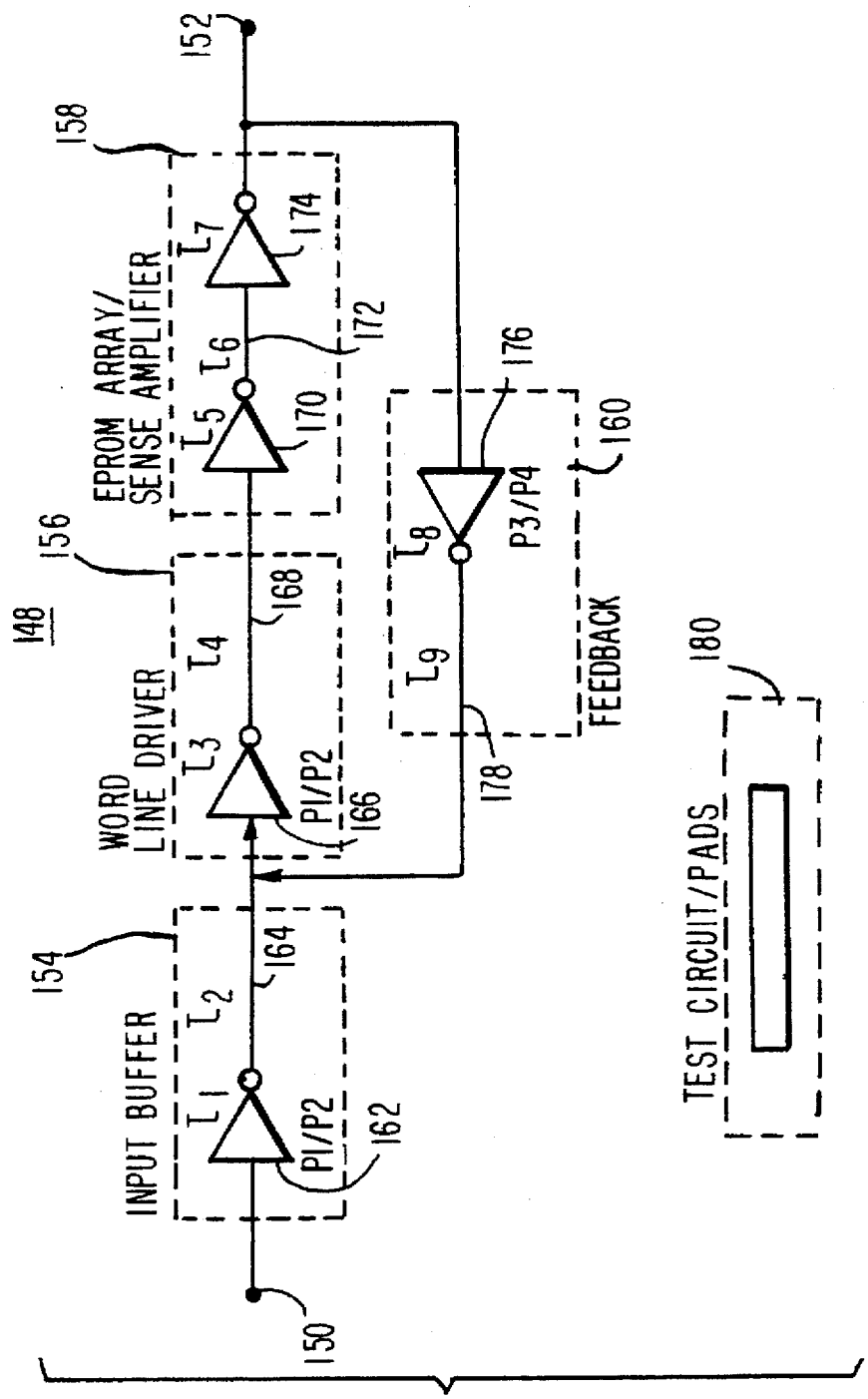
FIG. 4 is a circuit diagram of a complementary metal-oxide-semiconductor (CMOS) circuit design that can be used to fabricate integrated circuits using the method of FIG. 3.

A CMOS circuit 148 in which the die area reduction is maximized by allowing the delay time of a circuit component to drop is shown in FIG. 4. CMOS circuit 148 is a programmable logic device, which is a well-known type of circuit that provides logic outputs that are a programmable logic function of the logic inputs to the device. Data is passed from data input 150 to data output 152 via input buffer 154, word line driver 156, and electrically-programmable read-only memory (EPROM) array/sense amplifier 158. A feedback circuit 160 is connected between the output of EPROM array/sense amplifier 158 and the input of word line driver 156.

Each component of circuit 148 in the data pathway between input 150 and output 152 has an associated delay time. Input buffer 154 has a delay of $L_1$ associated with buffer circuitry 162 and a delay of $L_2$ associated with routing connections 164. Word line driver 156 has a delay of $L_3$ associated with word line driver circuitry 166 and a delay of $L_4$ associated with routing connections 168. EPROM array/sense amplifier 158 has a delay of $L_5$ associated with EPROM driver circuitry 170, a delay of $L_6$ associated with routing connections 172, and a delay of $L_7$ associated with sense amplifier circuitry 174. Delays of $L_8$ and $L_9$ are associated with feedback amplifier circuitry 176 and routing connections 178 of feedback circuit 160, respectively.

Test circuits and pads 180 are also part of circuit 148, but do not affect the data pathway between input 150 and output 152.

Because circuit 148 is a CMOS circuit, the delay time associated with each logic component can be controlled by varying the gate lengths of the transistors in the component. CMOS circuits are made up of n-channel and p-channel field-effect transistors. In order to avoid drain-to-source breakdown under high voltage conditions, p-channel gate lengths sometimes must be slightly larger than the gate lengths of comparable n-channel transistors. Preferably, the gate lengths to be varied to adjust the delay times with a given circuit design are parameterized. As shown in FIG. 4, parameters $P_1$ and $P_2$ are associated with buffer circuitry 162. $P_1$ is a parameter representing the gate lengths of n-channel transistors in buffer circuitry 162. $P_2$ is a parameter representing the gate lengths of p-channel transistors in buffer circuitry 162. Parameters $P_1$ and $P_2$ are also associated with word line driver circuitry 166. Parameters $P_3$ and $P_4$, which represent the gate length of n- and p-channel transistors, respectively, are associated with feedback amplifier circuitry 176.

The attributes of four different circuit implementations (Nos. 1–4) using the circuit design of circuit 148 are set forth in the table of FIG. 5. The process used for each circuit and the minimum gate lengths that can be achieved using that process are listed. The parameters $P_1$, $P_2$, $P_3$, and $P_4$ define the gate lengths of the transistors in buffer circuitry 162, word line driver circuitry 166, and feedback amplifier circuitry 176. For each circuit, the delays $L_1$–$L_9$ associated with that circuit and the total delay time associated with the data pathway from input 150 to output 152 are given.

Circuit Nos. 1 and 3 are older circuits, implemented using processes 1 and 2, respectively. Circuit Nos. 2 and 4 are fabricated using process N, which is a newer, more advanced process than processes 1 and 2. Circuit No. 2 is compatible with circuit No. 1, but occupies less die area than circuit No. 1. Circuit No. 4 is compatible with circuit No. 3, but occupies less die area than circuit No. 3.

The smallest lateral dimension and thus minimum gate length that can be fabricated using process 1 is 1.5 µm. As shown in the table in FIG. 5, gate lengths of 1.5 µm are used in circuit No. 1 for the transistors in buffer circuitry 162, word line driver circuitry 166, and feedback amplifier circuitry 176. The remaining circuitry in circuit No. 1, such as the circuitry in EPROM array/sense amplifier 158, is fabricated as small as permitted by process 1 (i.e., with lateral dimensions of 1.5 µm). The delay times $L_1$–$L_9$ for circuit No. 1 result in a total delay time of 35 ns for data passing from input 150 to output 152.

When the circuit design of circuit No. 1 is implemented using process N, it becomes possible to shrink the circuit die area. With process N, the minimum lateral dimension that can be fabricated is 0.65 μm. Circuit No. 2 uses the same circuit design as circuit No. 1, but is fabricated using process N. Certain components in circuit No. 2 are fabricated as small as permitted by process N.

For example, EPROM array/sense amplifier 158 of circuit No. 2 is fabricated with lateral dimensions of 0.65 μm, which reduces the die area occupied by EPROM array/sense amplifier 158 in circuit No. 2 relative to that of circuit No. 1. Fabricating EPROM array/sense amplifier 158 with lateral dimensions of 0.65 μm also has the effect of reducing the delay times associated with EPROM array/sense amplifier 158 ($L_5$–$L_7$) by a total of 9 ns. All of the circuit dimensions in EPROM array/sense amplifier 158 are shrunk to the minimum allowed by process N, because EPROM array/sense amplifier 158 occupies a fairly large fraction (about 10%) of the total die area of circuit 148 and because increasing the gate lengths of the transistors in EPROM array/sense amplifier 158 even a small amount has a relatively large impact on the total area occupied by EPROM array/sense amplifier 158. Allowing the delay time associated with EPROM array/sense amplifier 158 to decrease so that EPROM array/sense amplifier 158 can be reduced considerably in die area helps to maximize the die area reduction of circuit No. 2.

Test circuits and pads 180 are also fabricated at 0.65 μm in circuit No. 2, which reduces the die area associated with this portion of the circuit. Portions of input buffer circuitry 162, word line driver circuitry 166, and feedback amplifier circuitry 176 are fabricated as small as permitted by process N (0.65 μm), but the gate lengths of at least some selected transistors in input buffer circuitry 162, word line driver circuitry 166, and feedback amplifier circuitry 176 are fabricated with intentionally larger gate lengths to increase the delay times associated with these components sufficiently to compensate for the 9 ns decrease in the total delay time due to the faster operation of EPROM array/sense amplifier 158.

As indicated in the table of FIG. 5, in circuit No. 2 both n- and p-channel transistors in input buffer circuitry 162 and word line driver circuitry 166 are fabricated with gate lengths of 3.0 μm. Feedback amplifier circuitry 176 is fabricated with gate lengths of 3.7 μm. The increased gate lengths dictated by these values of parameters $P_1$–$P_4$ cause the delay times associated with input buffer circuitry 162, word line driver circuitry 166, and feedback amplifier circuitry 176 ($L_1$, $L_3$, and $L_8$) to increase from 5 ns to 9.5 ns each. As a result, the total delay time of the data pathway between input 150 to output 152 increases by 9 ns, compensating for the 9 ns decrease in the total delay time due to the faster operation of EPROM array/sense amplifier 158. The total delay time of circuit No. 2 is therefore 35 ns, which is the same as the total delay time of circuit No. 1. Because the total delay times of circuit Nos. 1 and 2 are equal, circuit Nos. 1 and 2 can be used interchangeably.

The smallest lateral dimension and minimum gate length that can be fabricated using process 2 is 1.0 μm. As shown in the table of FIG. 5, gate lengths of 1.0 μm are used in circuit No. 3 for the transistors in buffer circuitry 162, word line driver circuitry 166, and feedback amplifier circuitry 176. The remaining circuitry in circuit No. 3, such as the circuitry in EPROM array/sense amplifier 158, is fabricated as small as permitted by process 2 (i.e., with lateral dimensions of 1.0 μm). The delay times $L_1$–$L_9$ for circuit No. 3 result in a total delay time of 24 ns for data passing from input 150 to output 152.

When the circuit design of circuit No. 3 is implemented using process N, it becomes possible to shrink the circuit die area. With process N, the minimum lateral dimension that can be fabricated is 0.65 μm. Circuit No. 4 uses the same circuit design as circuit No. 3, but is fabricated using process N. Certain components in circuit No. 4 are fabricated as small as permitted by process N. For example, EPROM array/sense amplifier 158 of circuit No. 4 is fabricated with lateral dimensions of 0.65 μm, which reduces the die area occupied by EPROM array/sense amplifier 158 in circuit No. 4 relative to that of circuit No. 3. Fabricating EPROM array/sense amplifier 158 with lateral dimensions of 0.65 μm also has the effect of reducing the delay times in circuit No. 4 associated with EPROM array/sense amplifier 158 ($L_5$–$L_7$) by a total of 4 ns.

Test circuits and pads 180 in circuit No. 4 are also fabricated at 0.65 μm, which reduces the die area associated with that portion of the circuit. Portions of input buffer circuitry 162, word line driver circuitry 166, and feedback amplifier circuitry 176 are fabricated as small as permitted by process N (0.65 μm), but the gate lengths of at least some selected transistors in input buffer circuitry 162, word line driver circuitry 166, and feedback amplifier circuitry 176 are fabricated with intentionally larger gate lengths to increase the delay times associated with these components sufficiently to compensate for the 4 ns decrease in the total delay time due to the faster operation of EPROM array/sense amplifier 158.

As indicated in the table of FIG. 5, in circuit No. 4 both n- and p-channel transistors in input buffer circuitry 162, word line driver circuitry 166, and feedback amplifier circuitry 176 are fabricated with gate lengths of 1.5 μm. The increased gate lengths dictated by these values of parameters $P_1$–$P_4$ cause the delay times associated with input buffer circuitry 162, word line driver circuitry 166, and feedback amplifier circuitry 176 ($L_1$, $L_3$, and $L_8$) to increase from 3 ns to 5 ns each. As a result, the total delay time of the data pathway between input 150 to output 152 increases by 4 ns, which compensates for the 4 ns decrease in the total delay time due to the faster operation of EPROM array/sense amplifier 158. The total delay time of circuit No. 4 is therefore 24 ns, which is the same as the total delay time of circuit No. 3. Because the total delay times of circuit Nos. 3 and 4 are equal, circuit Nos. 3 and 4 can be used interchangeably.

One of the advantages of the present invention is that a circuit originally implemented using an old process can be implemented using a new process and yet have delay times for the data pathways through the new circuit that are compatible with the old circuit. Such new circuits are interchangeable with old circuits, but are more economical to manufacture and have lower power consumptions due to their reduced die areas. Another advantage of the present invention is that a common circuit layout can be developed for use with the new process. The common layout can then be used to fabricate a family of new circuits, each of which is interchangeable with a corresponding one of a number of old circuits.

Figure 6:
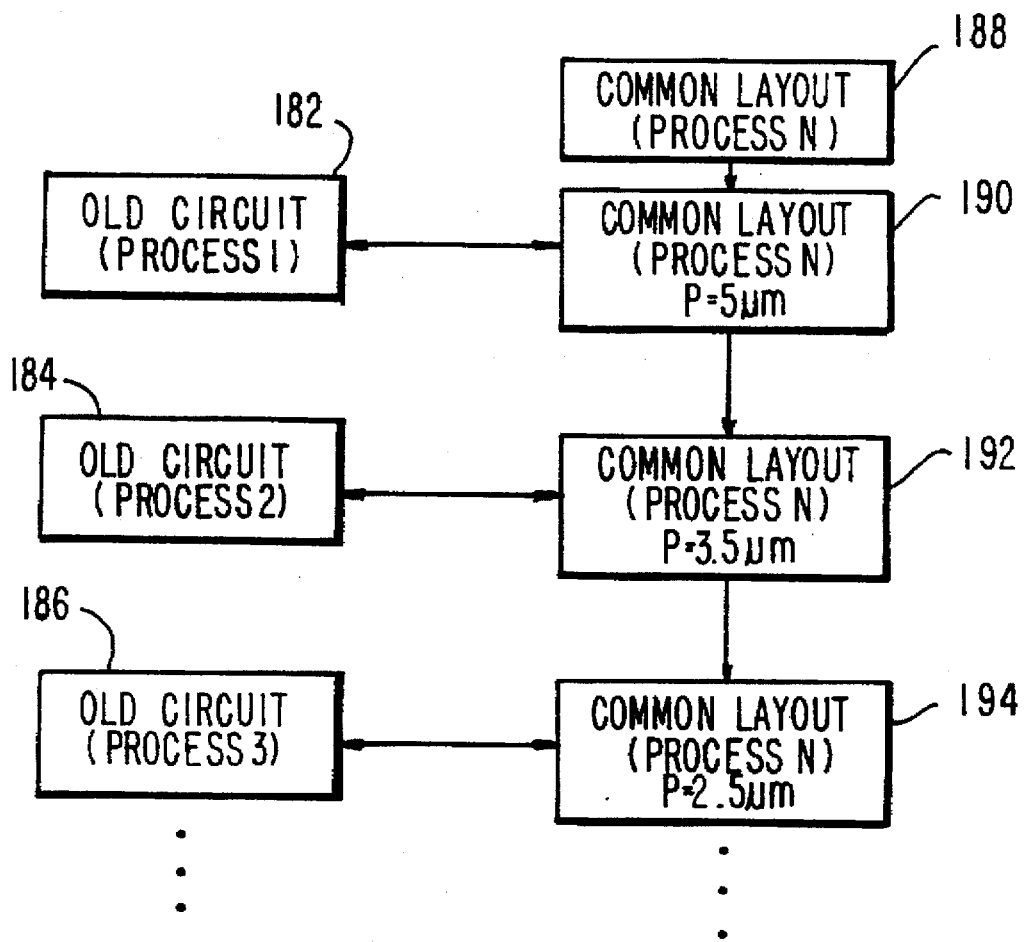
FIG. 6 is a diagram showing a group of old circuits and a family of corresponding new circuits fabricated using a common circuit layout.

For example, as shown in FIG. 6, when a circuit design is implemented using a number of different processes over a period of time, a group of old circuits 182, 184, and 186 is developed. Circuits 182, 184, and 186 share a common circuit design, but because each circuit is implemented using a different process, each circuit has different delay times associated with its data pathways. In order to replace old circuits 182, 184, and 186 with compatible new circuits, a common circuit layout 188 is created for use with process N.

Process N is a new, more advanced process than processes 1, 2, and 3. New circuits 190, 192, and 194 are fabricated using process N and therefore have smaller die areas and lower power consumptions than respective old circuits 182, 184, and 186.

The entire family of new circuits 190, 192, and 194 is fabricated using a common circuit layout 188. The only physical difference between circuits 190, 192, and 194 is that certain structures (such as the gates of some of the transistors) are fabricated with dimensions governed by adjustable parameters. The dimensions of these structures govern the associated delay times of the logic components in which they are contained.

In FIG. 6, parameter P corresponds to the gate length of certain transistors in the circuits 190, 192, and 194. In circuit 190, the value of P is 5 μm, which makes new circuit 190 interchangeable with old circuit 182 by ensuring that the total data pathway delay time for new circuit 190 is equal to the total data pathway delay time for old circuit 182. In circuit 192, the value of P is 3.5 μm, which makes new circuit 192 interchangeable with old circuit 184 by ensuring that the total data pathway delay time for new circuit 192 is equal to the total data pathway delay time for old circuit 184. In circuit 194, the value of P is 2.5 μm, which makes new circuit 194 interchangeable with old circuit 186 by ensuring that the total data pathway delay time for new circuit 194 is equal to the total data pathway delay time for old circuit 186. Only a single parameter (P) is used in conjunction with common layout 188, but numerous parameters (e.g., $P_1/P_2$ and $P_3/P_4$ of circuit 148 in FIG. 4) can be used, if desired.

As with any integrated circuit design, a number of masks are used to fabricate a complete circuit. Using a common layout allows the majority of these masks to be the same for each circuit in the family of new circuits. Only a few masks (e.g., the gate level masks) must be customized for circuits 190, 192, and 194, to allow the structures (such as the gates) that have sizes determined by the adjustable parameter P to be fabricated appropriately for each circuit.

Figure 7:
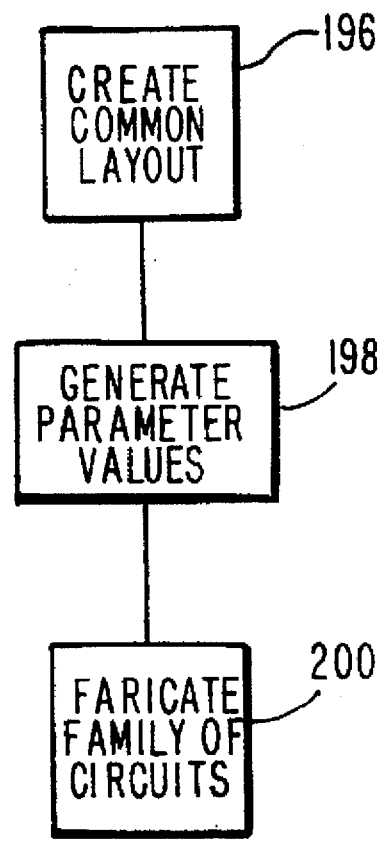
FIG. 7 is a flow chart of the steps involved in fabricating a family of new circuits using a common circuit layout.

The steps involved in fabricating a family of new circuits using a common layout are shown in FIG. 7. At step 196, a suitable common layout is created from which a family of new circuits can be constructed. At least one structure in the common layout has dimensions which are governed by a variable parameter. The dimensions of the structure determine the delay time associated with the logic component in which the structure is contained. At step 198, a family of parameter values is generated. Each parameter value is associated with a new circuit. At step 200, the family of new circuits is fabricated. Each new circuit in the family is fabricated based on the parameter values associated with that circuit using the common layout created at step 196. The total delay time of each new circuit is equal to the total delay time of the corresponding old circuit.

The foregoing is merely illustrative of the principles of this invention and various modifications can be made by those skilled in the art without departing from the scope and spirit of the invention.

What is claimed is:

1. A method of fabricating integrated circuits in which a circuit design originally implemented using an old process to form a first integrated circuit is implemented using a new fabrication process to form a second integrated circuit, said second integrated circuit having a die area that is smaller than that of said first integrated circuit, said first and second integrated circuits each having a data input, a data output, and a plurality of components each occupying a respective die area, at least some of said components having an associated delay time and being connected between said data input and said data output to form a pathway having a total delay time, said method comprising the steps of:

identifying a predetermined component on said first integrated circuit with a die area that can be reduced by fabricating said predetermined component with said new fabrication process; and fabricating said second integrated circuit including said predetermined component using said new fabrication process on said second integrated circuit, said predetermined component having a die area that is reduced relative to said die area of said predetermined component on said first integrated circuit, said total delay time of said pathway on said second integrated circuit being equal to said total delay time of said pathway on said first integrated circuit.

2. The method defined in claim 1 wherein said predetermined component on said first integrated circuit with a die area that can be reduced is test circuits and pads, said step of fabricating said predetermined component using said new fabrication process comprising the step of fabricating said test circuits and pads on said second integrated circuit with a die area that is reduced relative to said die area of said test circuits and pads on said first integrated circuit.

3. The method defined in claim 1 wherein said predetermined component is one of the components in said pathway between said data input and said data output having one of said associated delay times, said step of fabricating said predetermined component comprising the step of fabricating said predetermined component using said new fabrication process on said second integrated circuit with an associated delay time that is reduced relative to said associated delay time of said predetermined component on said first integrated circuit, said method further comprising the step of fabricating at least one of said components in said pathway other than said predetermined component using said new fabrication process on said second integrated circuit with an associated delay time that is increased to compensate for the reduced associated delay time of said predetermined component.

4. The method defined in claim 3 wherein said predetermined component is EPROM array/sense amplifier circuitry, said EPROM array/sense amplifier circuitry having a die area and an associated delay time on said first integrated circuit, said step of fabricating said predetermined component comprising the step of fabricating said EPROM array/sense amplifier circuitry using said new process on said second integrated circuit with a die area that is reduced relative to said die area of said EPROM array/sense amplifier circuitry on said first integrated circuit and with a reduced associated delay time relative to said associated delay time of said EPROM array/sense amplifier on said first integrated circuit.

5. The method defined in claim 4 wherein said at least one component in said pathway other than said predetermined component includes input buffer circuitry and word line driver circuitry, each having a die area and an associated delay time on said first integrated circuit, said step of fabricating said at least one component in said pathway other than said predetermined component comprising the step of fabricating said input buffer circuitry and said word line driver circuitry using said new fabrication process on said second integrated circuit such that said associated delay times of said input buffer circuitry and said word line driver circuitry are increased to compensate for said reduced associated delay time of said EPROM array/sense amplifier circuitry.

6. The method defined in claim 5 wherein said first and second integrated circuits each further comprise feedback circuitry having an associated delay time, said feedback circuitry connecting said EPROM array/sense amplifier circuitry to said word line driver circuitry, said method further comprising the step of fabricating said feedback circuitry on said second integrated circuit with said new fabrication process, said associated delay time of said feedback circuitry on said second integrated circuit being increased relative to said associated delay time of said feedback circuitry on said first integrated circuit so that said feedback circuitry is synchronized with said EPROM array/sense amplifier circuitry and said word line driver circuitry.

7. A method of fabricating integrated circuits in which a circuit design originally implemented using a plurality of old fabrication processes to form a plurality of old circuits is implemented using a new fabrication process to form a family of new circuits, said new fabrication process allowing said new circuits to be fabricated with smaller die areas than said old circuits, each new circuit being interchangeable with a corresponding one of said old circuits and having a smaller die area than said corresponding one of said old circuits, said old circuits and said new circuits each having a data input, a data output, and a plurality of components, said components having associated delay times and being connected between said data input and said data output to form a pathway having a total delay time, said method comprising the steps of:

creating a common layout from which said family of new circuits can be constructed and which has a component containing a structure that has an associated parameter;

generating a family of parameter values for said parameter, such that for each new circuit one of said parameter values governs the dimensions of said structure in said component, said dimensions governing said associated delay time of said component; and fabricating said family of new circuits using said new process, said total delay time of each new circuit being equal to said total delay time of said corresponding old circuit.

* * * * *